(12) United States Patent
Komine et al.

(10) Patent No.: US 9,772,566 B2
(45) Date of Patent: Sep. 26, 2017

(54) MASK ALIGNMENT MARK, PHOTOMASK, EXPOSURE APPARATUS, EXPOSURE METHOD, AND MANUFACTURING METHOD OF DEVICE

(71) Applicant: Toshiba Memory Corporation, Minato-ku (JP)

(72) Inventors: Nobuhiro Komine, Nagoya (JP); Kazuo Tawarayama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 146 days.

(21) Appl. No.: 14/845,912

(22) Filed: Sep. 4, 2015

(65) Prior Publication Data

US 2017/0003606 A1    Jan. 5, 2017

Related U.S. Application Data

(60) Provisional application No. 62/186,608, filed on Jun. 30, 2015.

(51) Int. Cl.
*G03F 1/42* (2012.01)
*G03F 7/20* (2006.01)
*G03F 9/00* (2006.01)

(52) U.S. Cl.
CPC .............. *G03F 9/7046* (2013.01); *G03F 1/42* (2013.01); *G03F 9/7026* (2013.01); *G03F 7/70633* (2013.01); *G03F 7/70641* (2013.01); *G03F 7/70683* (2013.01); *G03F 9/7088* (2013.01)

(58) Field of Classification Search
CPC .... G03F 1/42; G03F 7/70633; G03F 7/70641; G03F 7/70683; G03F 9/7026; G03F 9/7046; G03F 9/7088
USPC .............. 430/5, 22, 30; 250/491.1; 257/797
See application file for complete search history.

(56) References Cited

U.S. PATENT DOCUMENTS

| | | | |
|---|---|---|---|
| 5,300,786 A | 4/1994 | Brunner et al. | |
| 6,674,511 B2 | 1/2004 | Nomura et al. | |
| 6,940,585 B2 | 9/2005 | Nomura et al. | |
| 6,967,719 B2 | 11/2005 | Sato et al. | |
| 7,248,349 B2 | 7/2007 | Sato et al. | |
| 7,523,438 B2 | 4/2009 | Hsu et al. | |
| 7,678,513 B2 | 3/2010 | Nomura | |
| 9,128,388 B2 | 9/2015 | Komine | |
| 2003/0117627 A1 | 6/2003 | Sato et al. | |
| 2006/0019180 A1 | 1/2006 | Nomura | |
| 2006/0061756 A1 | 3/2006 | Sato et al. | |
| 2011/0300472 A1 | 12/2011 | Komine et al. | |
| 2014/0370719 A1 | 12/2014 | Komine | |

FOREIGN PATENT DOCUMENTS

| | | |
|---|---|---|
| JP | 2539163 | 10/1996 |
| JP | 2002-55435 | 2/2002 |
| JP | 2003-142385 A | 5/2003 |
| JP | 2003-178966 | 6/2003 |
| JP | 3615181 | 1/2005 |
| JP | 2006-39148 | 2/2006 |
| JP | 2008-124177 | 5/2008 |
| JP | 2011-77422 | 4/2011 |
| JP | 2012-190945 A | 10/2012 |
| JP | 2015-2205 | 1/2015 |

OTHER PUBLICATIONS

Office Action issued Oct. 24, 2016 in Taiwanese Patent Application No. 104137394 (with English translation).
Korean Office Action issued Oct. 19, 2016 in Patent Application No. 10-2015-0168454 (with English Translation).

*Primary Examiner* — Christopher Young
(74) *Attorney, Agent, or Firm* — Oblon, McClelland, Maier & Neustadt, L.L.P.

(57) ABSTRACT

According to one embodiment, there is provided a mask alignment mark disposed on a photomask irradiated by an illumination optical system with illumination light from a direction inclined with respect to an optical axis and used to form a latent image on a substrate through a projection optical system. The mask alignment mark including a plurality of patterns arranged in a predetermined direction at a pitch of substantially $P=\lambda/\{2\times(1-\sigma)\times(LNA)\}$, where $\sigma$ is a ratio of a numerical aperture INA of illumination light incident on the photomask from the illumination optical system to a numerical aperture LNA of an object side of the projection optical system (INA)/(LNA), and $\lambda$ is a wavelength of light.

20 Claims, 9 Drawing Sheets

MASK ALIGNMENT MARK, PHOTOMASK, EXPOSURE APPARATUS, EXPOSURE METHOD, AND MANUFACTURING METHOD OF DEVICE

CROSS-REFERENCE TO RELATED APPLICATIONS

This application is based upon and claims the benefit of priority from U.S. Provisional Application No. 62/186,608, filed on Jun. 30, 2015; the entire contents of which are incorporated herein by reference.

FIELD

Embodiments described herein relate generally to a mask alignment mark, a photomask, an exposure apparatus, an exposure method, and a manufacturing method of a semiconductor device.

BACKGROUND

In an exposure apparatus, an illumination optical system irradiates a photomask with illumination light, and the light from the photomask is projected on a substrate through a projection optical system, whereby a latent image is formed on the substrate. At this time, it is desired to improve the alignment accuracy of the photomask and the substrate.

DETAILED DESCRIPTION

In general, according to one embodiment, there is provided a mask alignment mark disposed on a photomask irradiated by an illumination optical system with illumination light from a direction inclined with respect to an optical axis and used to form a latent image on a substrate through a projection optical system. The mask alignment mark including a plurality of patterns arranged in a predetermined direction at a pitch of substantially $P=\lambda/\{2\times(1-\sigma)\times(LNA)\}$, where $\sigma$ is a ratio of a numerical aperture INA of illumination light incident on the photomask from the illumination optical system to a numerical aperture LNA of an object side of the projection optical system (INA)/(LNA), and $\lambda$ is a wavelength of light.

Exemplary embodiments of a photomask will be explained below in detail with reference to the accompanying drawings. The present invention is not limited to the following embodiments.

Embodiment

Figure 1:
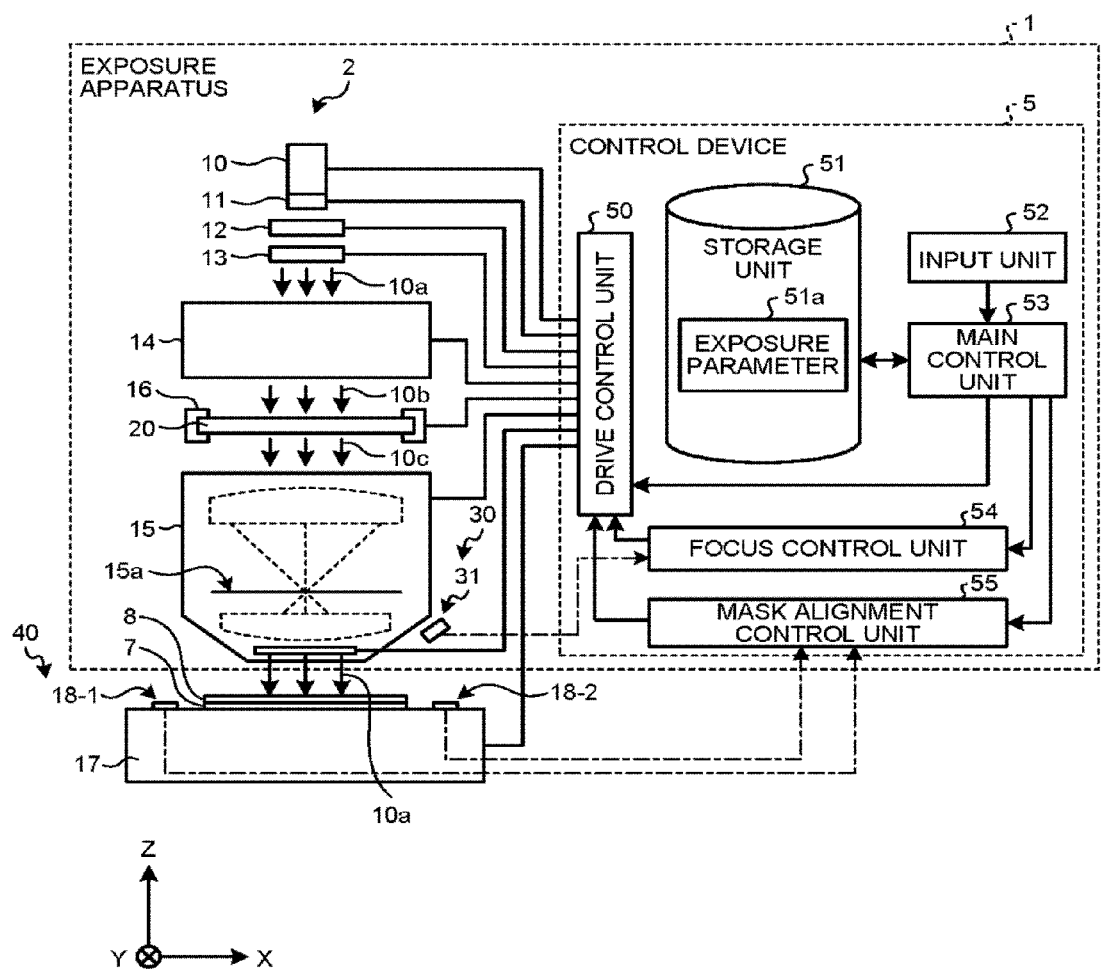
FIG. 1 is a diagram illustrating an example of a configuration of an exposure apparatus to which a photomask according to an embodiment is applied.

A photomask 20 according to the embodiment is applied to an exposure apparatus which performs exposure processing in an optical lithography process in a manufacturing method of a device, such as a semiconductor device. For example, the photomask 20 is applied to an exposure apparatus 1 including a transmission type optical system as illustrated in FIG. 1. FIG. 1 is a diagram illustrating an example of a configuration of an exposure apparatus to which a photomask according to an embodiment is applied. Hereinafter, regarding the optical axis of a projection optical system 15, the direction away from a substrate 7 is a +Z direction. Furthermore, two directions which are orthogonal to each other on a plane perpendicular to the Z direction are an X direction and a Y direction. Moreover, directions around an X axis, a Y axis, and a Z axis are a θX direction, a θY direction, and a θZ direction respectively.

The exposure apparatus 1 includes an exposure apparatus main body 2 and a control device 5. The control device 5 includes an input unit 52, a main control unit 53, a storage unit 51, a focus control unit 54, a mask alignment control unit 55, and a drive control unit 50. The main control unit 53 receives input of an exposure parameter (for example, an exposure amount or a focus value) through the input unit 52 and stores the received input as exposure parameter information 51a in the storage unit 51. Furthermore, the main control unit 53 controls, based on the exposure parameter information 51a, each part of the exposure apparatus main body 2 through the drive control unit 50.

The exposure apparatus main body 2 includes a light source 10, an aperture diaphragm 11, a filter 12, a polarization filter 13, an illumination optical system 14, the projection optical system 15, a mask stage 16, a focus detection system 30, a mask alignment detection system 40, and a substrate stage 17.

The mask stage 16 holds the photomask 20. The mask stage 16 moves in the X direction, the Y direction, and the Z direction, and rotates the θX direction, the θY direction, and the θZ direction while holding the photomask 20. Thus, the mask stage 16 determines the position of the photomask 20.

The substrate stage 17 holds the substrate The substrate stage 17 moves in the X direction, the Y direction, and the Z direction, and rotates in the θX direction, the θY direction, and the θZ direction while holding the substrate 7. Thus the substrate stage 17 determines the position of the substrate 7.

Figure 2A:
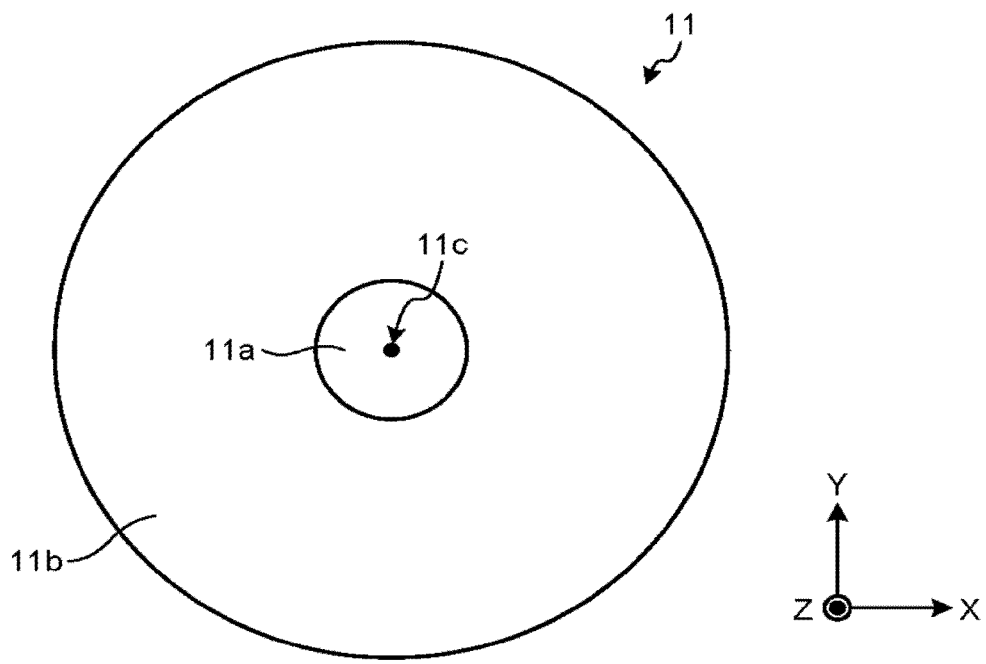
FIG. 2A is a diagram illustrating an illumination shape when telecentric illumination is used.

As illustrated in FIG. 2A, the aperture diaphragm 11 has, for example, a substantially disk-like shape and include an aperture area (illumination area) 11a and a shielding area (illumination shielding area) 11b. FIG. 2A is a diagram illustrating a planer shape of the aperture diaphragm 11 and illustrates an illumination shape when telecentric illumination is used. In the telecentric illumination, the illumination optical system 14 illuminates the photomask 20 with illumination light from the direction substantially coinciding with the optical axis (see FIG. 1). The shielding area 11b is the area to shield light 10a emitted from the light source 10, and the aperture area 11a is the area to transmit the light 10a emitted from the light source 10. The aperture area 11a includes a center position 11c corresponding to the optical axis. That is, the aperture diaphragm 11 adjusts the illumination shape to the illumination shape of the telecentric illumination. In accordance with this, the illumination optical system 14 irradiates the photomask 20 with illumination light 10b having the adjusted illumination shape, and the substrate 7 is exposed through the projection optical system 15 with light 10c from the photomask 20, whereby a latent image is formed on a photosensitive material (for example, a resist) 8 applied on the substrate 7 (see FIG. 1). At this time, an intensity distribution of an effective light source corresponding to the telecentric illumination is formed on a pupil surface 15a of the projection optical system 15.

Furthermore, the focus detection system 30 measures the height of the substrate 7. The focus detection system 30 includes a focus sensor 31. The focus sensor 31 performs focus measurement to detect the Z direction (height direction) position of the substrate 7 by detecting a mark (focus mark) image for the focus measurement formed on the substrate 7. The focus control unit 54 receives the focus measurement result from the focus detection system 30. The focus control unit 54 controls, according to the focus measurement result, the substrate stage 17 through the drive control unit 50 so as to move the Z position of the substrate 7 closer to the best focus position. Thus, the focus control to correct the Z position of the substrate 7 is performed.

The mask alignment detection system 40 performs alignment of the photomask 20 and the substrate 7. The mask alignment detection system 40 includes a plurality of optical sensors 18-1 and 18-2. Each optical sensor 18 is, for example, an illuminance sensor and performs mask alignment measurement to detect the alignment position of the photomask 20 and the substrate 7 by detecting the light having the intensity of a predetermined threshold or more. The mask alignment control unit 55 receives the mask alignment measurement result from the mask alignment detection system 40. The mask alignment control unit 55 controls, according to the mask alignment measurement result, the substrate stage 17 through the drive control unit 50 so as to align the photomask 20 and the substrate 7. Thus, the mask alignment control to correct the relative XY positions of the photomask 20 and the substrate 7 is performed.

When a circuit pattern is formed on the substrate 7 in the optical lithography process, the so-called out-of-focus state is caused unless the height of the substrate 7 is appropriately controlled to the focus position of the exposure apparatus 1, and it is difficult to form a desired circuit pattern on the substrate 7. That is, it is desired that the focus measurement to detect to the Z direction (height direction) position of the substrate 7 is accurately performed, and the focus control to move the Z position of the substrate 7 to the best focus position using the measurement result is accurately performed by the substrate stage 17. With miniaturization of a circuit pattern used in a device, such as a semiconductor device, it is increasingly desired to improve the accuracy of the focus measurement and the focus control.

In order to improve the focus measurement, between a first transmission part and a second transmission part on the photomask, a step to generate a phase difference from each other can be provided. At this time, it is possible to lead the light transmitted through the first transmission part and the second transmission part in the direction asymmetrical with respect to the optical axis. Therefore, it is possible to greatly change an image forming position of a mark according to the Z position of the substrate 7 at the time of the focus measurement. The image forming position of the mark is greatly changed according to the Z position of the substrate 7, whereby it is possible to obtain the best focus position in the Z direction of the substrate 7 with high accuracy. However, when the wavelength of the exposure light becomes short, the step between the first transmission part and the second transmission part is required to be miniaturized, and the photomask fabrication may be difficult.

In order to improve the focus measurement without fabricating the step to the photomask, the photomask 20 can be illuminated using non-telecentric illumination. In the non-telecentric illumination, the illumination optical system 14 illuminates the photomask 20 with the illumination light from the direction inclined with respect to the optical axis. At this time, although the step to generate the phase difference is not provided on the photomask 20, it is possible to lead the light transmitted through the photomask 20 in the direction asymmetrical with respect to the optical axis. Therefore, it is possible to greatly change the image forming position of the mark according to the 2 position of the substrate 7 at the time of the focus measurement. The image forming position of the mark is greatly changed according to the Z position of the substrate 7, whereby it is possible to obtain the best focus position in the Z direction of the substrate 7 with high accuracy.

Figure 2B:
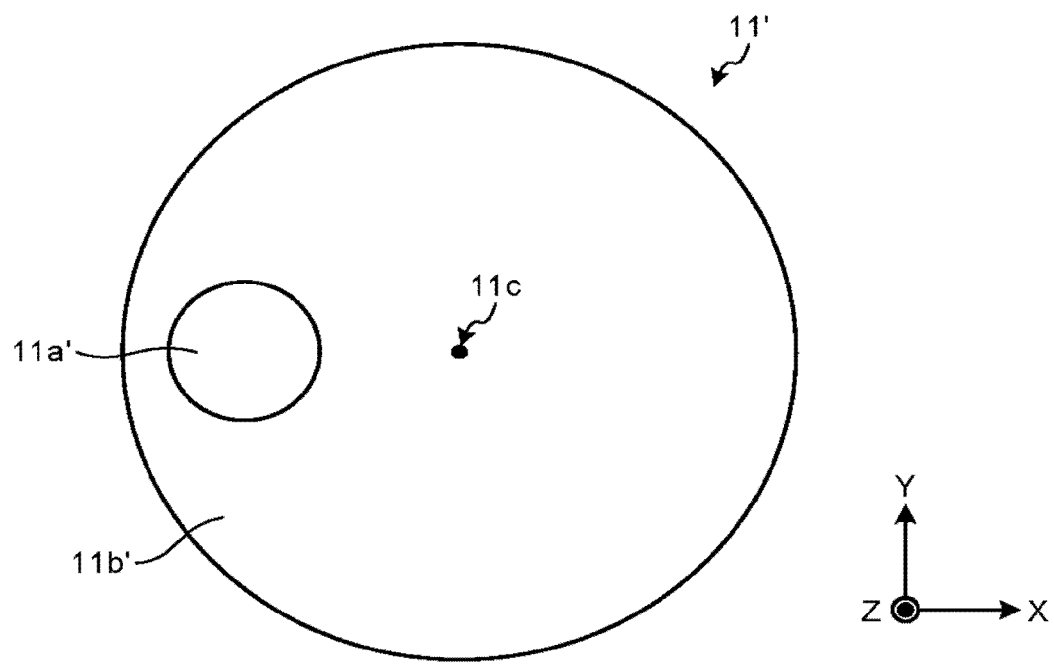
FIG. 2B is a diagram illustrating an illumination shape when non-telecentric illumination is used.

For example, an aperture diaphragm 11' illustrated in FIG. 2B is used instead of the aperture diaphragm 11 illustrated in FIG. 2A. FIG. 2B is a diagram illustrating a planer shape of the aperture diaphragm 11' and illustrates an illumination shape when the non-telecentric illumination is used. In the aperture diaphragm 11' illustrated in FIG. 2B, an aperture area 11a' does not include the center position 11c corresponding to the optical axis and is disposed at the position shifted from the center position 11c to the outer circumferential side. The center position 11c is shielded by a shielding area 11b'. Thus, the aperture diaphragm 11' can adjust the illumination shape to the illumination shape of the non-telecentric illumination, that is, an illumination shape of mono-pole illumination (off-axis mono-pole illumination).

Figure 3A:
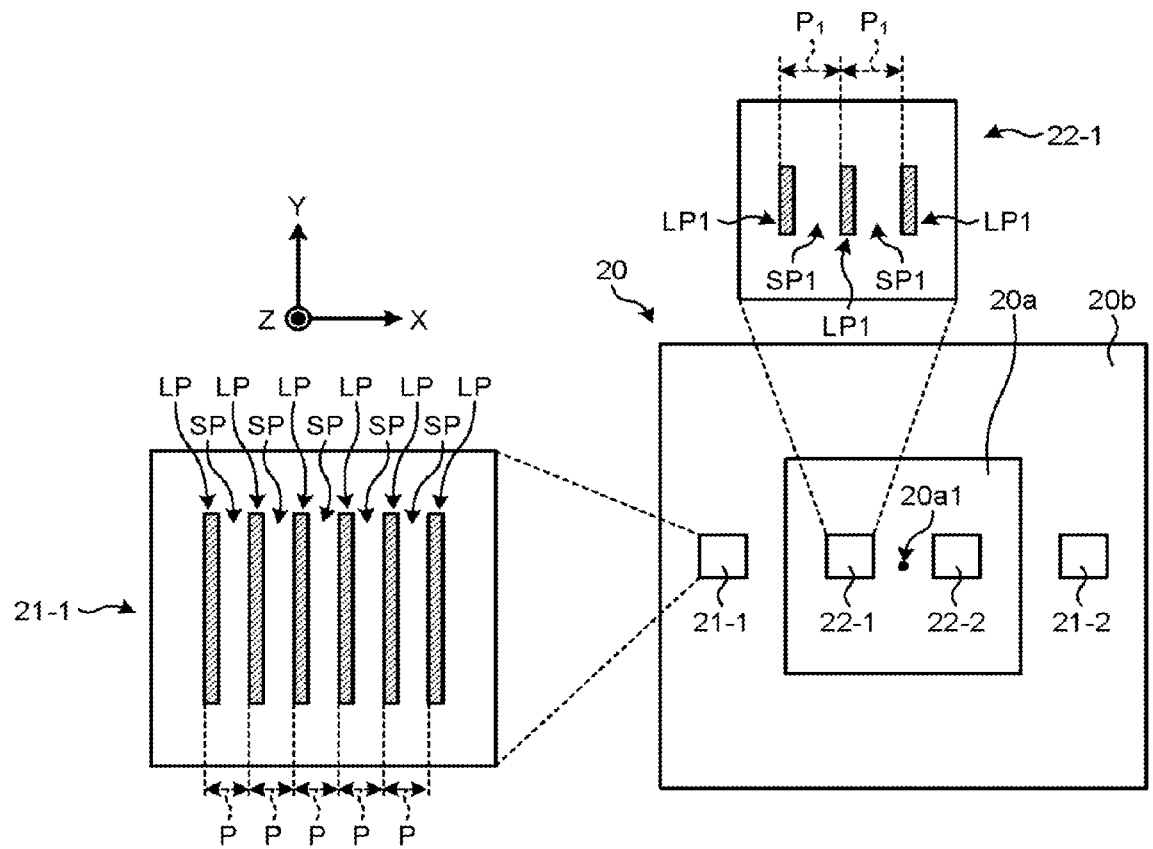
FIG. 3A is a plan view illustrating a configuration of the photomask according to the embodiment.

For example, marks (focus marks) 22-1 and 22-2 for the focus measurement are disposed in an effective exposure area 20a of the photomask 20 as illustrated in FIG. 3A. FIG. 3A is a plan view illustrating a configuration of the photomask according to the embodiment. In the effective exposure area 20a, a plurality of device patterns is disposed, and the focus marks 22-1 and 22-2 may be disposed in a kerf area among the plurality of device patterns.

In each focus mark 22, a line pattern LP1 and a space pattern SP1 are alternately repeatedly arranged in the X direction. The line pattern LP1 is a light-shielding pattern indicated by hatching with oblique lines in FIG. 3A. The space pattern SP1 is a light-transmitting pattern. The plurality of line patterns LP1 is arranged at a substantially constant pitch P1 in the X direction. The pitch P1 is adjusted in advance so that the light diffracted at the focus marks 22 is led in the direction asymmetrical with respect to the optical axis (see FIG. 4). The line pattern LP1 and the space pattern SP1 extend along the Y direction.

Note that, although not illustrated, the line pattern LP1 and the space pattern SP1 may be alternately repeatedly arranged in the Y direction in another area in the focus mark 22 in each focus mark 22. At this time, the plurality of line patterns LP1 is arranged at the substantially constant pitch P1 in the Y direction. The line pattern LP1 and the space pattern SP1 extend along the X direction.

Figure 4:
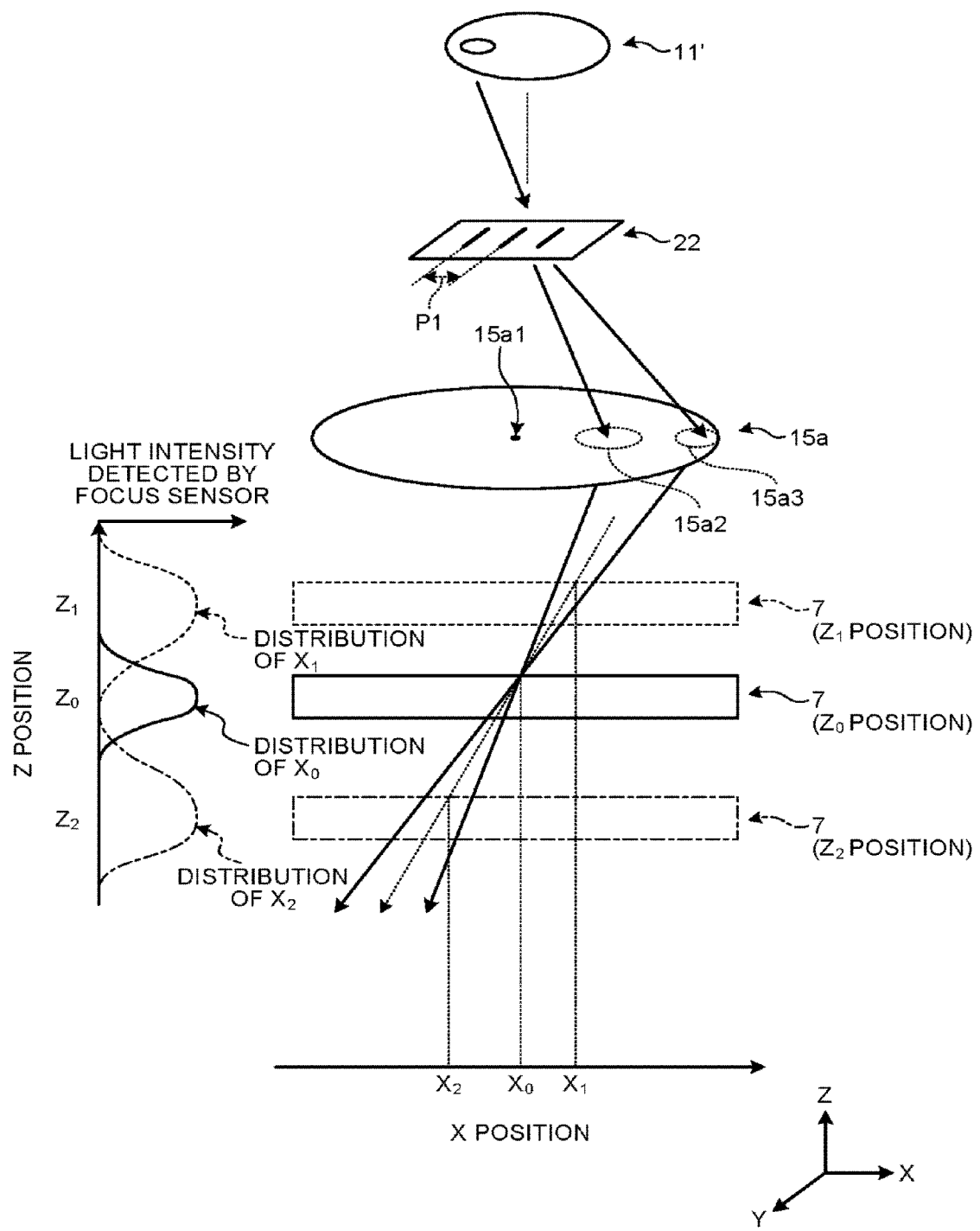
FIG. 4 is a diagram illustrating processing of focus measurement in the embodiment.

Then, the focus measurement is performed as illustrated in FIG. 4. FIG. 4 is a diagram illustrating processing of focus measurement in the embodiment. The aperture diaphragm 11 performs the non-telecentric illumination. That is, the focus mark 22 on the photomask 20 is illuminated with the illumination light from the direction inclined with respect to the optical axis (for example, an intermediate direction between the +X direction and the −Z direction). At this time, the pitch P1 for arranging the line pattern LP1 in the focus mark 22 is adjusted in advance so that the light diffracted at the focus mark 22 is led in the direction asymmetrical with respect to the optical axis. Thus, on the pupil surface 15a of the projection optical system 15, an area 15a2 asymmetrical about a center position 15a1 corresponding to the optical axis is irradiated with the light as illustrated in FIG. 4. Then, the light passing through the pupil surface 15a of the projection optical system 15 is led from the direction asymmetrical with respect to the optical axis to the substrate 7. The light is led from the direction inclined with respect to the optical axis (for example, an intermediate direction between the −X direction and the −Z direction) to the substrate 7.

For example, when it is known that an appropriate image forming position of the focus mark on the substrate 7 is X0, the appropriate image forming position X0 corresponds to the Z position Z0 which is the best focus position of the substrate 7.

As illustrated in FIG. 4, when the substrate 7 is positioned at the Z1 position shifted in +Z direction from the best focus position Z0, the image forming position of the focus mark is a position X1 shifted in the +X direction from the appropriate image forming position X0. At this time, the focus sensor 31 detects the image forming position X1 of the focus mark. The focus control unit 54 calculates a shift amount of the image forming position X1 from the appropriate image forming position X0 and controls the drive of the substrate stage 17 through the drive control unit 50 so as to correct the shift amount of the Z position according to the shift amount of the image forming position. Thus, it is possible to move the Z position of the substrate 7 to the best focus position (the Z0 position).

Alternatively, when the substrate 7 is positioned at the position 72 shifted in −Z direction from the best focus position Z0, the image forming position of the focus mark is the position X2 shifted in the −X direction from the appropriate image forming position X0. At this time, the focus sensor 31 detects the image forming position X2 of the focus mark. The focus control unit 54 calculates a shift amount of the image forming position X2 from the appropriate image forming position X0 and controls the drive of the substrate stage 17 through the drive control unit 50 so as to correct the shift amount of the Z position according to the shift amount of the image forming position. Thus, it is possible to move the Z position of the substrate 7 to the best focus position (the Z0 position).

Note that, the description of the shift amount of the image forming position X of the focus mark according to the Z position of the substrate 7 is similarly applicable to the image forming position Y of the focus mark.

On the other hand, when the circuit pattern is formed on the substrate 7 in the optical lithography process, it is desired to improve the alignment accuracy of the photomask 20 and the substrate 7 in addition to the focus measurement and the focus control.

For example, mask alignment marks 21-1 and 21-2 are disposed in the peripheral area 20b of the photomask as illustrated in FIG. 3A. The peripheral area 20b is disposed around the effective exposure area 20a and surrounds the effective exposure area 20a. In the peripheral area 20b, a plurality of mask alignment marks 21-1 and 21-2 may be disposed. The mask alignment marks 21-1 and 21-2 are disposed at the substantially point-symmetrical positions to each other about the point in the effective exposure area 20a (for example, a center point 20a1 of the effective exposure area 20a). The mask alignment marks 21-1 and 21-2 may be disposed at the substantially line-symmetrical positions to each other with respect to the line passing through the center point 20a1 of the effective exposure area 20a (for example, the line passing through the center point 20a1 and extending in the Y direction).

In each mask alignment mark 21, for example, a line pattern LP and a space pattern SP are alternately repeatedly arranged in the X direction. The line pattern LP is a light-shielding pattern indicated by hatching with oblique lines in FIG. 3A. The space pattern SP is a light-transmitting pattern. The line pattern LP and the space pattern SP extend along the Y direction.

Figure 3B:
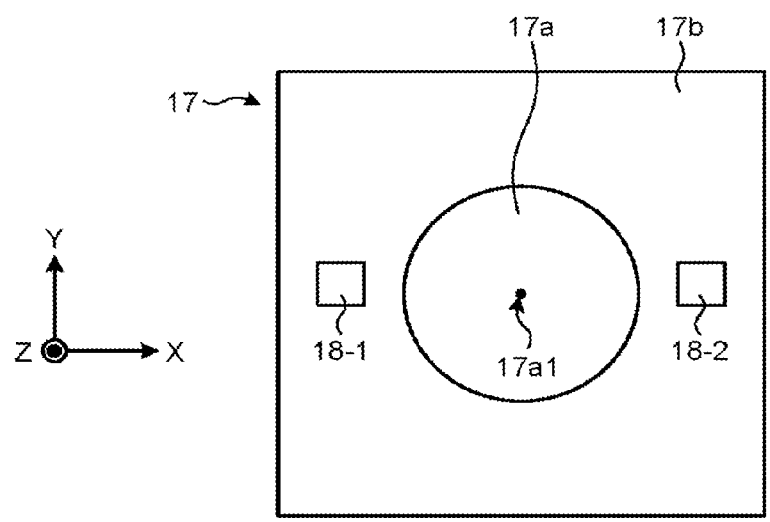
FIG. 3B is a plan view illustrating a configuration of a substrate stage according to the embodiment.

Furthermore, the plurality of optical sensors 18-1 and 18-2 in the mask alignment detection system 40 is disposed as illustrated in FIG. 3B. That is, the upper surface of the substrate stage 17 includes a substrate holding area 17a and a peripheral area 17b. The substrate holding area 17a is the area, where the substrate 7 is to be held, and corresponds to the effective exposure area 20a of the photomask 20. In the substrate holding area 17a, a suction mechanism to suck a substrate (not illustrated), such as a vacuum chuck or an electrostatic chuck, is provided. The peripheral area 17b is disposed around the substrate holding area 17a and surrounds the substrate holding area 17a. The peripheral area 17b corresponds to the peripheral area 20b of the photomask 20. The plurality of optical sensors 18-1 and 18-2 is disposed in the peripheral area 17b. The optical sensor 18-1 is disposed at the position corresponding to the mask alignment, mark 21-1 in the peripheral area 17b. The optical sensor 18-2 is disposed at the position corresponding to the mask alignment mark 21-2 in the peripheral area 17b. The optical sensors 18-1 and 18-2 are disposed at the substantially point-symmetrical positions to each other about the point in the substrate holding area 17a (for example, a center point 17a1 of the substrate holding area 17a). The optical sensor 18-1 and the optical sensor 18-2 may be disposed at the substantially line-symmetrical position to each other with respect to the line passing through the center point 17a1 of the substrate holding area 17a.

Each optical sensor 18 is, for example, an illuminance sensor and performs mask alignment measurement to detect the alignment position of the photomask 20 and the substrate 7 by detecting the light having the intensity of a predetermined threshold or more. When the relative positional relationship between the photomask 20 and the substrate 7 is appropriate, each optical sensor 18 is disposed at the position so as to receive the diffracted light of the mask alignment mark 21.

Figure 5:
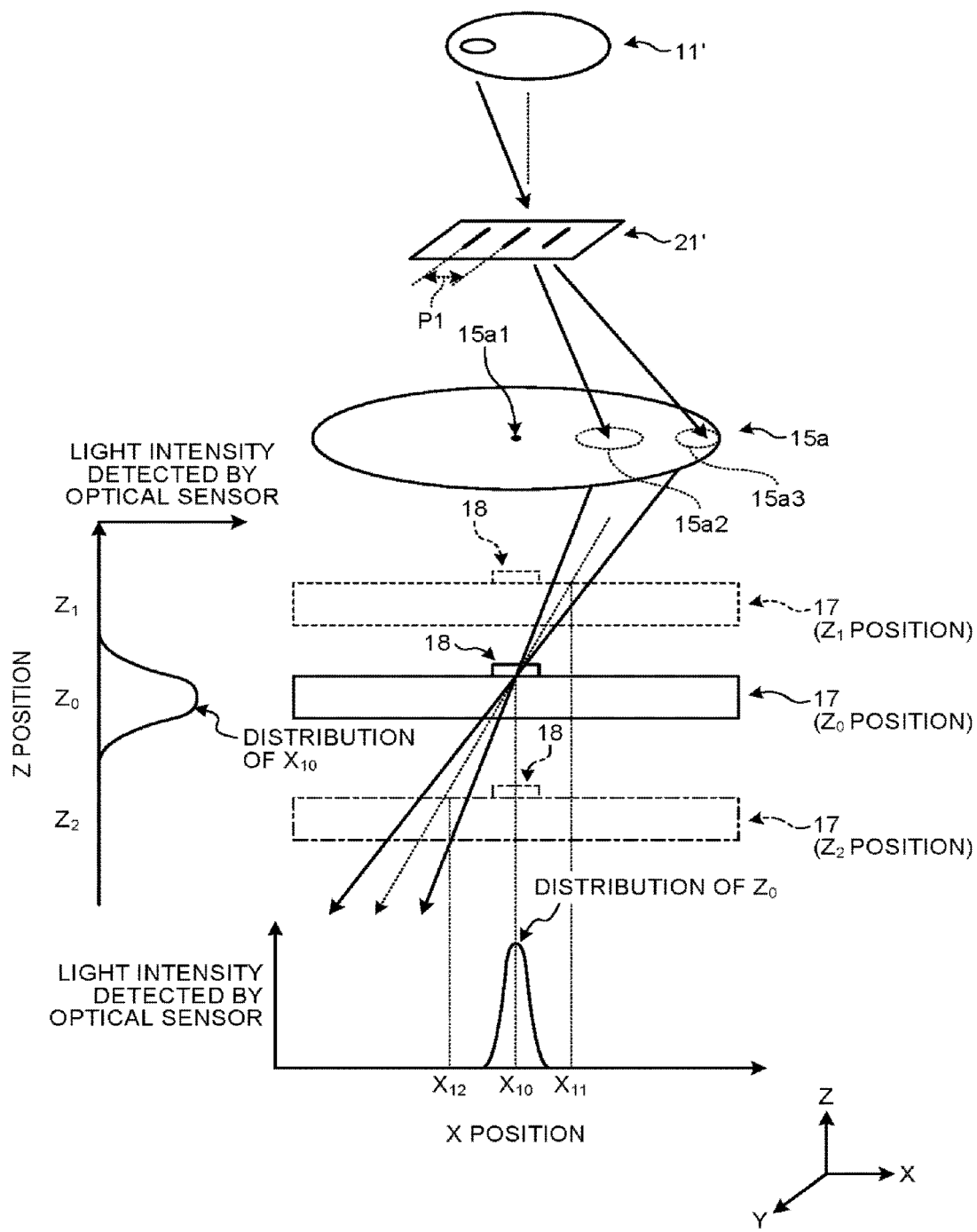
FIG. 5 is a diagram illustrating processing of mask alignment measurement when a pattern arranged at a pitch similar to the focus measurement is used.

At this time, if the pitch for arranging a plurality of line patterns LP in a mask alignment mark 21' is the pitch P1 similar to the focus mark 22 (see FIG. 3A), it may be difficult to appropriately perform the mask alignment measurement as illustrated in FIG. 5.

For example, the mask alignment measurement is performed as illustrated in FIG. 5. FIG. 5 is a diagram illustrating processing of mask alignment measurement when a pattern arranged at a pitch similar to the focus measurement is used. The aperture diaphragm 11' performs the non-telecentric illumination. That is, the mask alignment mark 21' on the photomask 20 is illuminated with the illumination light from the direction inclined with respect to the optical axis (for example, an intermediate direction between the +X direction and the −Z direction). At this time, the pitch P1 for arranging the line pattern LP in the mask alignment mark 21' is adjusted in advance so that the light diffracted at the mask alignment mark 21' is emitted in the direction asymmetrical with respect to the optical axis. Thus, on the pupil surface 15a of the projection optical system 15, the area 15a2 asymmetrical about the center position 15a1 corresponding to the optical axis is irradiated with the light as illustrated in FIG. 5. Then, the light passing through the pupil surface 15a of the projection optical system 15 is led from the direction asymmetrical with respect to the optical axis to the substrate 7. The light is led from the direction inclined with respect to the optical axis (for example, an intermediate direction between the −X direction and the −Z direction) to the substrate 7.

For example, when it is known that the relative XY positional relationship between the photomask 20 and the substrate 7 is appropriate and the image forming position of the mask alignment mark on the substrate stage 17 in the state where the substrate 7 is positioned at the best focus position is X10, the optical sensor 18 is disposed at the position X10 in the peripheral area 17b.

As illustrated in FIG. 5, when the substrate 7 is positioned at the Z1 position shifted in +Z direction from the Z0 position, the image forming position of the mask alignment mark on the substrate stage 17 is the position X11 shifted in the +X direction from the appropriate image forming position X10. Thus, when the relative positional relationship between the photomask 20 and the substrate 7 is appropriate, it may be difficult for the optical sensor 18 to receive the diffracted light of the mask alignment mark 21.

Alternatively, when the substrate 7 is positioned at the Z2 position shifted in −Z direction from the Z0 position, the image forming position of the mask alignment mark on the substrate stage 17 is the position X12 shifted in the −X direction from the appropriate image forming position X10. Thus, when the relative positional relationship between the photomask 20 and the substrate 7 is appropriate, it may be difficult for the optical sensor 18 to receive the diffracted light of the mask alignment mark 21.

That is, when the mask alignment mark 21' including the plurality of line patterns LP arranged at the pitch P1 is illuminated with the non-telecentric illumination, the light is emitted in the asymmetrical direction from the mask alignment mark 21', and it may be difficult to appropriately perform the mask alignment measurement.

In order to appropriately perform the mask alignment measurement, the mask alignment mark 21' including the plurality of line patterns LP arranged at the pitch P1 can be illuminated with the telecentric illumination. In this case, it is required that the focus measurement is performed with the non-telecentric illumination while the mask alignment measurement is performed with the telecentric illumination. Therefore, when the plurality of substrates 7 is exposed, the processing to switch an illumination condition (switching between the aperture diaphragm 11 illustrated in FIG. 2A and the aperture diaphragm 11' illustrated in FIG. 2B) is frequently performed. Thus, the throughput of the exposure processing of the plurality of substrates 7 may be reduced.

Therefore, by devising a pitch P for arranging the plurality of line patterns LP in the mask alignment mark 21 as described in the following, the present embodiment enables the appropriate mask alignment measurement to be performed using the non-telecentric illumination.

Figure 6:
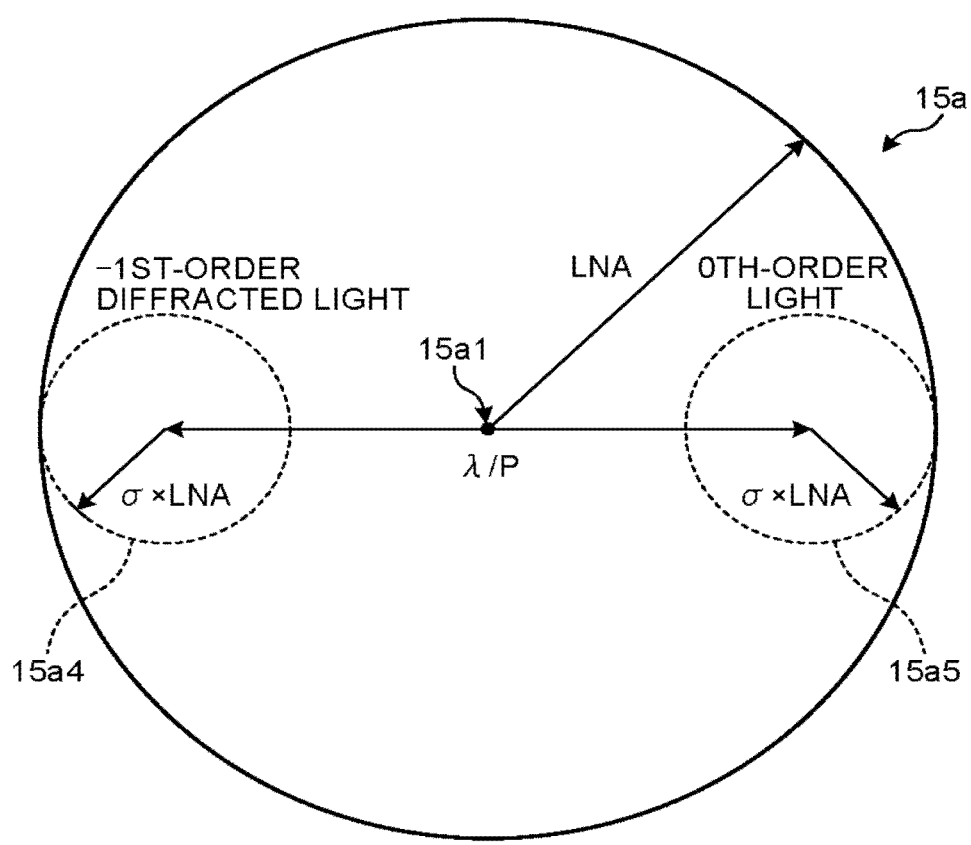
FIG. 6 is a diagram to describe a pitch of a pattern in a mask alignment mark in the embodiment.

More specifically, the pitch P for arranging the plurality of line patterns LP in the mask alignment, mark 21 is configured so that the distribution of the effective light source on the pupil surface 15a of the projection optical system 15 becomes the distribution as illustrated in the FIG. 6. FIG. 6 is a diagram to describe the pitch P of a pattern (line pattern LP) in the mask alignment mark 21.

For example, it is assumed that a numerical aperture of the illumination light incident on the photomask 20 from the illumination optical system 14 is INA, a numerical aperture of the object side of the projection optical system 15 is LNA, a ratio of the numerical aperture INA to the numerical aperture LNA (INA)/(LNA) is σ, and the wavelength of the light emitted from the light source 10 is λ. At this time, when an area 15a3 at one end side of both ends of the diameter passing through the center position 15a1 is irradiated with the −1st-order diffracted light, and an area 15a4 at the other end side is irradiated with the 0th-order light, the following Equation 1 is established for the pitch P for arranging the plurality of line patterns LP.

$$2 \times LNA = \lambda/P + 2 \times (\sigma \times LNA) \qquad \text{Equation 1}$$

When Equation 1 is solved for the pitch P, the following Equation 2 is obtained.

$$P = \lambda / \{2 \times (1-\sigma) \times (LNA)\} \qquad \text{Equation 2}$$

That is, by arranging the plurality of line patterns LP in the mask alignment mark 21 in a predetermined direction (for example, the X direction) at the pitch P of substantially Equation 2 (see FIG. 3A), it is possible to distribute the effective light source on the pupil surface 15a to the areas 15a4 and 15a5 which are symmetrical about the center position 15a1 as illustrated in FIG. 6. Thus, it is possible to appropriately perform the mark alignment measurement.

Note that, the plurality of patterns is only required to be arranged in the mask alignment mark 21 at the pitch P of Equation 2, the pattern in the mask alignment mark 21 is not limited to the line pattern LP and may be a pattern having other shapes. Furthermore, the direction to arrange the plurality of patterns in the mask alignment mark 21 is not limited to the X direction and may be other directions.

Figure 7:
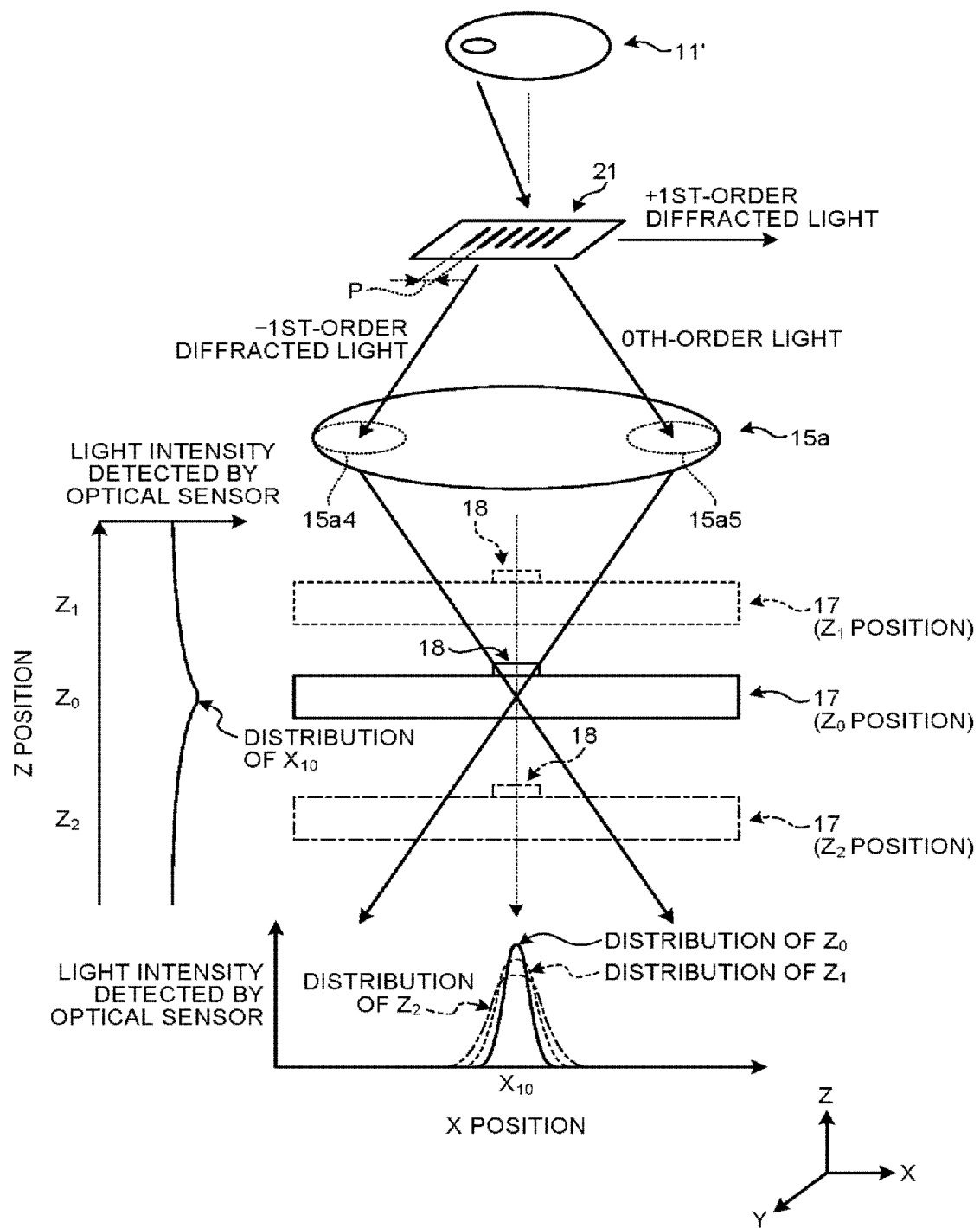
FIG. 7 is a diagram illustrating processing of mask alignment measurement in the embodiment.

For example, as illustrated in FIG. 7, the mask alignment measurement is performed. FIG. 7 is a diagram illustrating processing of the mask alignment measurement in the embodiment. The aperture diaphragm 11' performs the non-telecentric illumination. That is, the mask alignment mark 21 on the photomask 20 illuminated with the illumination light from the direction inclined with respect to the optical axis (for example, an intermediate direction between the +X direction and the −Z direction). At this time, the pitch P for arranging each line pattern LP in the mask alignment mark 21 is adjusted in advance so as to substantially satisfy the above Equation 2. Thus, on the pupil surface 15a of the projection optical system 15, the areas 15a4 and 15a5 which are symmetrical about the center position 15a1 corresponding to the optical axis may be irradiated with the light as illustrated in FIG. 7.

Note that, although the case in which the area 15a4 is irradiated with the −1st-order diffracted light and the area 15a5 is irradiated with the 0th-order light is exemplified in FIG. 7, as long as the areas 15a4 and 15a5 which are symmetrical about the center position 15a1 are irradiated with light, the light may be other diffracted light. For example, the area 15a4 may be irradiated with the 0th-order light, and the area 15a5 may be irradiated with the +1st-order diffracted light.

Then, the light passing through the pupil surface 15a of the projection optical system 15 is led from the direction symmetrical with respect to the optical axis to the substrate 7. That is, the main light beam composed of the −1st-order diffracted light and the 0th-order light is led from the direction (−Z direction) substantially coinciding with the optical axis to the substrate 7 as indicated by a dashed arrow in FIG. 7.

For example, when it is known that the relative XY positional relationship between the photomask 20 and the substrate 7 is appropriate and the image forming position of the mask alignment mark on the substrate stage 17 in the state where the substrate 7 is positioned at the best focus position is X10, the optical sensor 18 is disposed at the position X10 in the peripheral area 17b.

As illustrated in FIG. 7, when the substrate 7 is positioned at the Z1 position shifted in +Z direction from the Z0 position, the image forming position of the mask alignment mark on the substrate stage 17 is maintained at the appropriate image forming position X10. Thus, when the relative positional relationship between the photomask 20 and the substrate 7 is appropriate, it is possible for the optical sensor 18 to receive the diffracted light of the mask alignment mark 21.

Alternatively, when the substrate 7 is positioned at the Z2 position shifted in −Z direction from the Z0 position, the image forming position of the mask alignment mark on the substrate stage 17 is maintained at the appropriate image forming position X10. Thus, when the relative positional relationship between the photomask 20 and the substrate 7 is appropriate, it is possible for the optical sensor 18 to receive the diffracted light of the mask alignment mark 21.

That is, when the mask alignment mark 21 including the plurality of line patterns LE arranged at the pitch P satisfying Equation 2 is illuminated with the non-telecentric illumination, the light is emitted in the symmetrical direction from the mask alignment mark 21, and it is possible to appropriately perform the mask alignment measurement.

Note that, the description of the image forming position X of the mask alignment mark on the substrate stage 17 according to the Z position of the substrate 7 is similarly applicable to the image forming position Y of the mask alignment mark.

Figure 8:
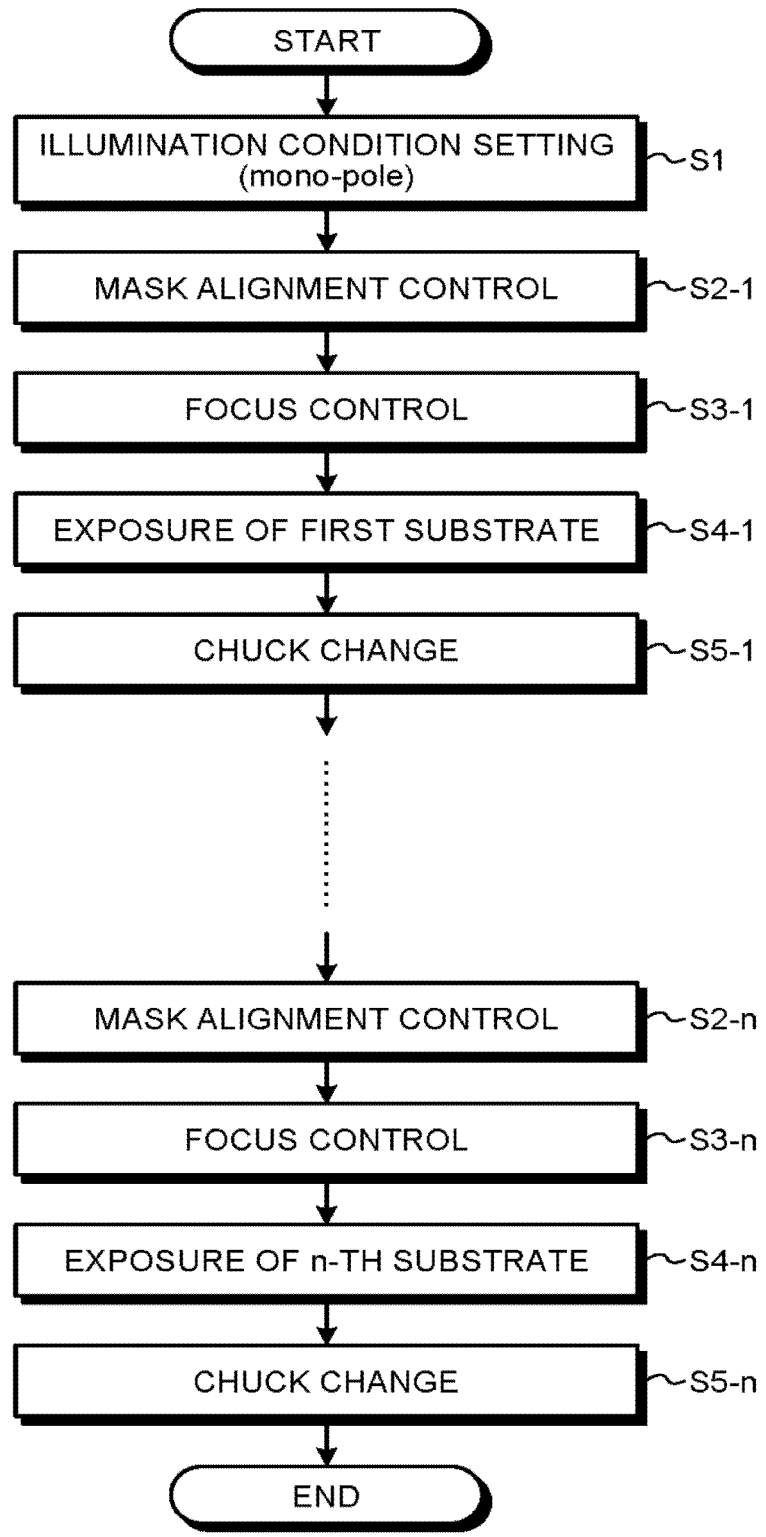
FIG. 8 is a flowchart illustrating operation of the exposure apparatus to which the photomask according to the embodiment is applied.

Next, the operation of the exposure apparatus 1 to which the photomask 20 is applied will be described with reference to FIG. 8. FIG. 8 is a flowchart illustrating the operation of the exposure apparatus 1 to which the photomask 20 is applied.

The control device 5 sets, according to the exposure parameter 51a, the non-telecentric illumination, that is, the illumination condition of the mono-pole illumination (off-axis mono-pole illumination) (S1). For example, the control device 5 inserts the aperture diaphragm 11' (see FIG. 2B) into the optical path from the light source 10 to the illumination optical system 14. A transfer device transfers, for example, n-number (n is an integer of 2 or more) of the substrates 7 into the exposure apparatus 1. The substrate stage 17 holds the transferred substrate 7 under the control of the control device 5.

While the non-telecentric illumination is being performed, the control device 5 performs the mask alignment control (S2-1). For example, the mask alignment detection system 40 performs the mask alignment measurement under the control of the control device 5. The control device 5 receives the mask alignment measurement result from the mask alignment detection system 40. The control device 5 controls, according to the mask alignment measurement result, the substrate stage 17 through the drive control unit 50 so as to align the photomask 20 and the substrate 7. Thus, the mask alignment control to correct the relative XY positions of the photomask 20 and the substrate 7 is performed.

While the non-telecentric illumination is being performed, the control device 5 performs the focus control (S3-1). For example, the focus detection system 30 performs the focus measurement under the control of the control device 5. The control device 5 receives the focus measurement result from the focus detection system 30. The control device 5 controls, according to the focus measurement result, the substrate stage 17 through the drive control unit 50 so as to move the Z position of the substrate 7 closer to the best focus position. Thus, the focus control to correct the Z position of the substrate 7 is performed.

While the non-telecentric illumination is being performed, the control device 5 performs the exposure processing of the substrate 7 (S4-1). For example, the illumination optical system 14 irradiates the photomask 20 with illumination light, and the substrate 7 is exposed through the projection optical system 15 with the light from the photomask 20, whereby a latent image is formed on the photosensitive material (for example, a resist) 8 applied on the substrate 7.

The substrate stage 17 exchanges, under the control of the control device 5, the substrate held by the suction mechanism (a vacuum chuck or an electrostatic chuck) from the 1st substrate 7 to the 2nd substrate 7 (S5-1).

The similar processing is performed to the 2nd to n-th substrate. For example, the mask alignment control (S2-n), the focus control (S3-n), the exposure processing (S4-n), the exchange of the substrate to be processed (25-n) are performed to n-th substrate in this order. Note that, in the processing of each substrate (S2 to S5), the order of the mask alignment control and the focus control (S3) may be replaced with each other.

As described above, in the present embodiment, the mask alignment mark 21 of the photomask 20 is configured so that the plurality of patterns in the mask alignment mark 21 is arranged at the pitch P satisfying the above Equation 2. Thus, the effective light source on the pupil surface 15a of the projection optical system 15 can be distributed to the areas 15a4 and 15a5 which are symmetrical about the center position 15a1, and the light can be led from the projection optical system 15 in the symmetrical direction and incident on the substrate stage 17. As a result, it is possible to perform the appropriate mask alignment measurement while using the non-telecentric illumination.

If it is required that the focus measurement is performed with the non-telecentric illumination while the mask alignment measurement is performed with the telecentric illumination, when the plurality of substrates 7 is exposed, the processing to switch the illumination condition is frequently performed. For example, in the processing of FIG. 8, it is required that the processing to switch the illumination condition to the condition of the telecentric illumination immediately before each of S2-1, S2-2, . . . , and S2-n is added, and it is further required that the processing to switch the illumination condition to the condition of the non-telecentric illumination immediately before each of S3-1, S3-2, . . . , and S3-n is added. Thus, the processing to switch the illumination condition is frequently performed, and the throughput of the exposure processing of the plurality of substrates 7 may be reduced.

In contrast, in the embodiment, both of the mask alignment measurement and the focus measurement can be performed with the non-telecentric illumination, and the setting of illumination condition can be reduced to one time in S1 as illustrated in the FIG. 8. Thus, it is possible to improve the throughput of the exposure processing of the plurality of substrates 7.

Furthermore, in the present embodiment, the mask alignment marks 21-1 and 21-2 in the photomask 20 are disposed at the substantially point-symmetrical positions to each other about the point in the effective exposure area 20a (for example, the center point 20a1 of the effective exposure area 20a). The mask alignment marks 21-1 and 21-2 may be disposed at the substantially line-symmetrical positions to each other with respect to the line passing through the center point 20a1 of the effective exposure area 20a (for example, the line passing through the center point 20a1 and extending in the Y direction). Thus, the mask surface of the photomask 20 can be easily made substantially parallel to the upper surface of the substrate stage 17.

Note that the concept of the present embodiment may be applied to an exposure apparatus including a reflection type optical system. In the configuration of the exposure apparatus 1 of FIG. 1, when the transmission type optical system is replaced with an optically equivalent reflection type optical system and the transmission type photomask 20 is replaced with an optically equivalent reflection type photomask 95, the similar efficient to the present embodiment can be obtained.

Figure 9:
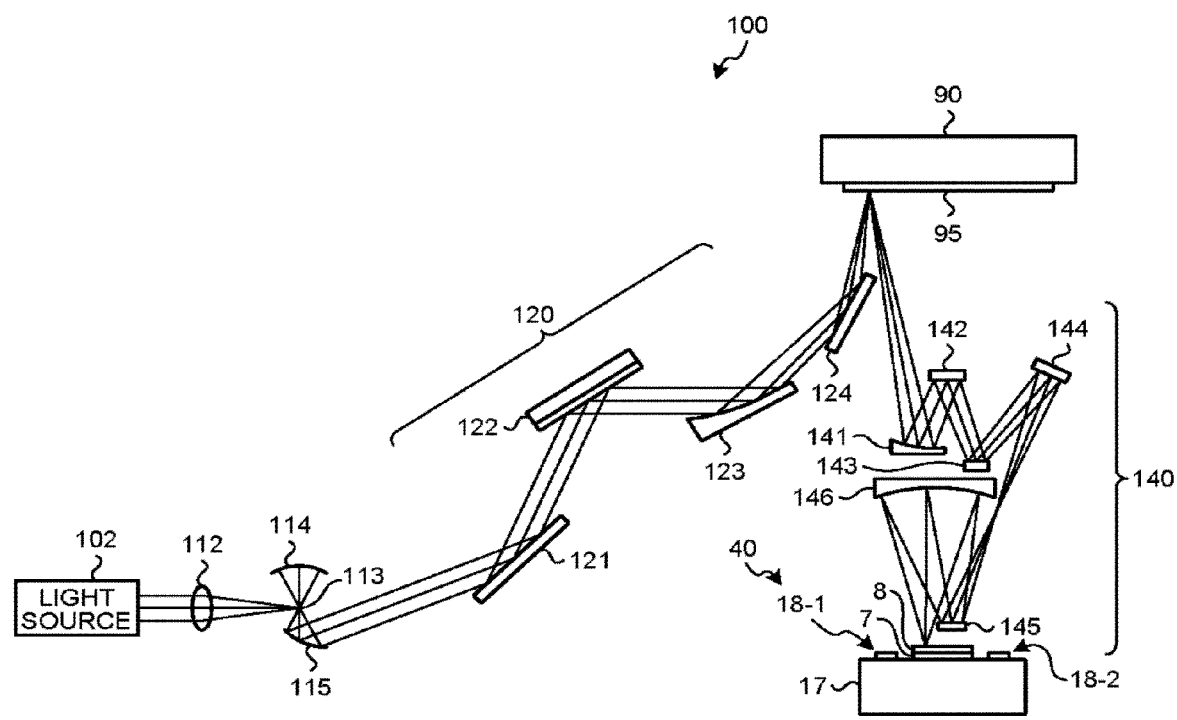
FIG. 9 is a diagram illustrating another example of a configuration of the exposure apparatus to which the photomask according to the embodiment is applied.

For example, an exposure apparatus 100 including the reflection type optical system has a configuration as illustrated in FIG. 9. FIG. 9 is a diagram illustrating another example of a configuration of the exposure apparatus to which the photomask according to the embodiment is applied. In FIG. 9, to simplify the description and the illustration, the illustration and the description of the control device 5 and the focus detection system 30 are omitted.

The exposure apparatus 100 is, for example, a step-and-scan-system reduced-projection exposure apparatus. The exposure apparatus 100 includes a light source 102 which emits EUV light, an illumination optical system 120 which propagates the light emitted from the light source 102, and a mask stage 90 which is irradiated with the light propagated by the illumination optical system 120. The mask stage 90 holds the photomask 95.

The exposure apparatus 100 includes a projection optical system 140 which propagates the light reflected by the photomask 95, and the substrate stage 17 which is exposed with the light propagated by the projection optical system 140. The substrate stage 17 holds the substrate 7.

A condenser lens 112 is disposed at the position adjacent to the light source 102 and condenses the exposure light (laser light) emitted from the light source 102 on a focal point 113. The exposure light having the wavelength shorter than that of the light from the light source 10 (for example, EUV light having soft-X-ray from 12 nm to 14 nm) is emitted from the focal point 113. The emitted exposure light (EUV light) is condensed by an oval mirror 114 and reflected by a parabolic mirror 115.

In the exposure apparatus 100, since the wavelength of the exposure light (EUV light) is very short and appropriate lens materials (high transmissivity and a refractive index difference) for constituting a refraction optical system does not exist, it is required to use the reflection type optical system and the reflection type mask. The illumination optical system 120 and the projection optical system 140 are the reflection type optical system, and the photomask 95 is the reflection type mask. In the photomask 95, the plurality of focus marks arranged at the pitch P1 is disposed in the effective exposure area, and the plurality of mask alignment marks arranged at the pitch P of Equation 2 is disposed in the peripheral area surrounding the effective exposure area (see FIG. 3A).

The illumination optical system 120 propagating the EUV light reflected by the parabolic mirror 115 includes reflection mirrors 121 and 122, a condenser mirror 123, and an optical path bending mirror 124. The EUV light is reflected by the reflection mirrors 121 and 122, and reflected and condensed by the condenser mirror 123. The EUV light reflected and condensed by the condenser mirror 123 is reflected by the optical path bending mirror 124. The EUV light reflected by the optical path bending mirror 124 reaches the mask stage 90 or the photomask 95 fixed to the mask stage 90 by electrostatic attraction force.

The projection optical system 140 is disposed under the mask stage 90. The substrate stage 17 which holds, for example, the substrate 7 is disposed under the projection optical system 140. The projection optical system 140 includes a condenser mirror 141, optical path bending mirrors 142 and 143, a condenser mirror 144, an optical path bending mirror 145, and a condenser mirror 146. The EUV light reflected by the photomask 95 is reflected and condensed by the condenser mirror 141 and reflected by the optical path bending mirrors 142 and 143. Furthermore, the EUV light is reflected and condensed by the condenser mirror 144 and reflected by the optical path bending mirror 145. The EUV light reflected by the optical path bending mirror 145 is condensed and reflected by the condenser mirror 146 and focused on the photosensitive material (a resist film) 6 applied on the surface of, for example, the substrate 7.

In the exposure apparatus 100, the wavelength of the exposure light (EUV light) is very short to miniaturize a lithography. When a step is provided so as to generate a phase difference between the first transmission part and the second transmission part on the photomask in order to improve the focus measurement, the step amount is required to be extremely reduced (for example, 3 nm), and it is difficult to obtain sufficient fabrication accuracy. In this case, as the above embodiment, the mask alignment mark of the photomask 95 is configured so that the plurality of patterns in the mask alignment mark is arranged at the pitch P satisfying the above Equation 2. Thus, the effective light source on the pupil surface of the projection optical system 140 can be distributed to the areas which are symmetrical about the center position, and the light can be led from the projection optical system 140 in the symmetrical direction and incident on the substrate stage 17. As a result, it is possible to perform the appropriate mask alignment measurement while using the non-telecentric illumination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask alignment mark disposed on a photomask irradiated by an illumination optical system with illumination light from a direction inclined with respect to an optical axis and used to form a latent image on a substrate through a projection optical system, the mask alignment mark comprising:
a plurality of patterns arranged in a predetermined direction at a pitch of substantially $$P=\lambda/\{2\times(1-\sigma)\times(LNA)\}$$

where $\sigma$ is a ratio of a numerical aperture INA of illumination light incident on the photomask from the illumination optical system to a numerical aperture LNA of an object side of the projection optical system (INA)/(LNA), and $\lambda$ is a wavelength of light.

2. The mask alignment mark according to claim 1, wherein
the plurality of patterns includes a plurality of line patterns.

3. The mask alignment mark according to claim 1, wherein
the mask alignment mark is used for alignment of the photomask and the substrate.

4. A photomask comprising the mask alignment mark according to claim 1.

5. The photomask according to claim 4, further comprising:
an effective exposure area; and
a peripheral area surrounding the effective exposure area,
wherein
the mask alignment mark is disposed in the peripheral area.

6. A photomask comprising a plurality of mask alignment marks, each according to claim 1.

7. The photomask according to claim 6, further comprising:
an effective exposure area; and
a peripheral area surrounding the effective exposure area,
wherein
each of the plurality of mask alignment marks is disposed in the peripheral area.

8. The photomask according to claim 7, wherein
the plurality of mask alignment marks includes:
a first mask alignment mark disposed in the peripheral area; and
a second mask alignment mark disposed at a separated position interposing the effective exposure area in the peripheral area.

9. The photomask according to claim 8, wherein
the first mask alignment mark and the second mask alignment, mark are disposed at point-symmetrical positions to each other about a point in the effective exposure area.

10. The photomask according to claim 9, wherein
the first mask alignment mark and the second mask alignment mark are disposed at line-symmetrical positions to each other about a line passing through a center of the effective exposure area.

11. An exposure apparatus comprising:
the photomask according to claim 4 including an effective exposure area and a peripheral area surrounding the effective exposure area, and a mask alignment mark being disposed in the peripheral area; and
a substrate stage holding a substrate and including a substrate holding area corresponding to the effective exposure area and a second peripheral area surrounding the substrate holding area, and an optical sensor being disposed at a position corresponding to the mask alignment mark in the second peripheral area.

12. An exposure apparatus comprising:
a photomask according to claim 6 including an effective exposure area and a peripheral area surrounding the effective exposure area, and a plurality of mask alignment marks being disposed in the peripheral area; and
a substrate stage holding a substrate and including a substrate holding area corresponding to the effective exposure area and a second peripheral area surrounding the substrate holding area, and a plurality of optical sensors being disposed at a position corresponding to the plurality of mask alignment marks in the second peripheral area.

13. The exposure apparatus according to claim 12, wherein
the plurality of mask alignment marks includes:
a first mask alignment mark disposed in the peripheral area; and
a second mask alignment mark disposed at a separated position interposing the effective exposure area in the peripheral area, and
the plurality of optical sensors includes:
a first optical sensor disposed at a position corresponding to the first mask alignment mark in the second peripheral area; and
a second optical sensor disposed at a position corresponding to the second mask alignment mark in the second peripheral area.

14. The exposure apparatus according to claim 13, wherein
the first mask alignment mark and the second mask alignment, mark are disposed at point-symmetrical positions to each other about a point in the effective exposure area, and
the first optical sensor and the second optical sensor are disposed at substantially point-symmetrical positions to each other about a point in the substrate holding area.

15. The exposure apparatus according to claim 14, wherein
the first mask alignment mark and the second mask alignment mark are disposed at line-symmetrical positions to each other about a line passing through a center of the effective exposure area, and
the first optical sensor and the second optical sensor are disposed at substantially line-symmetrical positions to each other about a line passing through a center of the substrate holding area.

16. The exposure apparatus according to claim 12, further comprising:
an illumination optical system capable of illuminating the photomask with illumination light, from a direction inclined with respect to an optical axis; and a projection optical system that projects light from the photomask on the substrate.

17. An exposure method comprising:
setting an illumination condition in which a photomask is irradiated with illumination light from a direction inclined with respect to an optical axis; and
performing alignment of the photomask and the substrate using a mask alignment mark having a plurality of patterns under the illumination condition, wherein
the plurality of patterns is disposed on the photomask used to form a latent image on a substrate through a projection optical system and arranged in a predetermined direction at a pitch of substantially $$P=\lambda/\{2\times(1-\sigma)\times(LNA)\}$$

where $\sigma$ is a ratio of a numerical aperture INA of illumination light incident on the photomask from the illumination optical system to a numerical aperture LNA of an object side of the projection optical system (INA)/(LNA), and $\lambda$ is a wavelength of light.

18. The exposure method according to claim 17, further comprising
exposing the substrate by the illumination optical system and the illumination optical system under the illumination condition.

19. The exposure method according to claim 18, further comprising
performing focus control under the illumination condition, wherein
the exposing is performed while the focus control is being performed.

20. A manufacturing method of device comprising:
exposing a substrate with the exposure method according to claim 17; and
developing the exposed substrate.

* * * * *